US006562099B2

(12) United States Patent
Orme-Marmerelis et al.

(10) Patent No.: US 6,562,099 B2
(45) Date of Patent: May 13, 2003

(54) HIGH-SPEED FABRICATION OF HIGHLY UNIFORM METALLIC MICROSPHERES

(75) Inventors: Melissa Orme-Marmerelis, Irvine, CA (US); Robert F. Smith, Costa Mesa, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 09/860,802

(22) Filed: May 18, 2001

(65) Prior Publication Data

US 2002/0029659 A1 Mar. 14, 2002

Related U.S. Application Data

(60) Provisional application No. 60/206,514, filed on May 22, 2000.

(51) Int. Cl.$^{7}$ .................................................. B22F 9/14

(52) U.S. Cl. ............................. 75/335; 75/336; 75/340

(58) Field of Search .......................... 75/331, 335, 336, 75/337, 338; 264/10

(56) References Cited

U.S. PATENT DOCUMENTS

| | | | | |
|---|---|---|---|---|
| 4,068,241 A | | 1/1978 | Yamada | 346/75 |
| 4,264,641 A | * | 4/1981 | Mahoney et al. | 264/10 |
| 4,288,797 A | | 9/1981 | Horike et al. | 346/75 |
| 4,734,705 A | | 3/1988 | Rezanka et al. | 346/1.1 |
| 5,171,360 A | | 12/1992 | Orme et al. | 75/331 |
| 5,226,948 A | | 7/1993 | Orme et al. | 75/331 |
| 5,259,593 A | | 11/1993 | Orme et al. | 266/78 |
| 5,266,098 A | | 11/1993 | Chun et al. | 75/335 |
| 5,340,090 A | | 8/1994 | Orme et al. | 266/202 |
| 5,407,458 A | | 4/1995 | König et al. | 75/255 |
| 5,415,679 A | * | 5/1995 | Wallace | 75/331 |
| 5,432,541 A | | 7/1995 | Pickell et al. | 347/74 |
| 5,445,666 A | | 8/1995 | Peschka et al. | 75/335 |
| 5,520,715 A | | 5/1996 | Oeftering | 75/335 |
| 5,722,479 A | | 3/1998 | Oeftering | 164/46 |
| 5,746,844 A | | 5/1998 | Sterett et al. | 148/522 |
| 5,810,988 A | | 9/1998 | Smith, Jr. et al. | 204/666 |
| 5,861,323 A | | 1/1999 | Hayes | 438/111 |
| 5,891,212 A | | 4/1999 | Tang et al. | 75/335 |
| 5,894,980 A | | 4/1999 | Orme-Marmarelis et al. | 228/33 |
| 5,894,985 A | | 4/1999 | Orme-Marmarelis et al. | 228/262 |
| 5,938,102 A | | 8/1999 | Muntz et al. | 228/102 |
| 5,960,853 A | | 10/1999 | Sterett et al. | 164/271 |
| 6,007,183 A | | 12/1999 | Horine | 347/46 |
| 6,027,699 A | | 2/2000 | Holcomb et al. | 422/186.04 |
| 6,082,605 A | | 7/2000 | Farnworth | 228/33 |
| 6,186,192 B1 | | 2/2001 | Orme-Marmarelis et al. | 141/18 |
| 6,224,180 B1 | | 5/2001 | Pham-Van-Diep et al. | 347/2 |

* cited by examiner

*Primary Examiner*—George Wyszomierski
(74) *Attorney, Agent, or Firm*—Orrick, Herrington & Sutcliffe LLP

(57) ABSTRACT

In a high-speed fabrication process for producing highly uniform metallic microspheres, a molten metal is passed through a small orifice, producing a stream of molten metal therefrom. A series of molten metal droplets forms from the break up of the capillary stream. To achieve high uniformity of the spheres and avoid defects, the droplets are cooled before being captured. Separating the droplets, by causing them to travel in different paths than their adjacent droplets, helps to facilitate the cooling of the droplets. The droplets can be separated by electrostatically charging them as they break off from the capillary stream. The droplets are then passed through an electric field, which can be produced by a pair of deflection plates. The droplets are dispersed by varying the electric field—e.g., by rotating the plates or by varying the voltage applied thereto—or by varying the electrostatic charge of the droplets. Advantageously, the droplets can be actively cooled in flight by passing them through a cryogenic gas chamber.

14 Claims, 4 Drawing Sheets

HIGH-SPEED FABRICATION OF HIGHLY UNIFORM METALLIC MICROSPHERES

This application is related to U.S. applications Ser. Nos. 09/860,803 and 09/860,798, filed May 18, 2001, the contents of which are hereby fully incorporated by reference. This application is related to provisional U.S. application Ser. No. 60/206,514, filed May 22, 2000, the contents of which are hereby fully incorporated by reference.

This invention was made with Government support under Grant No. DMI-9457205, awarded by NSF: The Government has certain rights in this invention.

FIELD OF THE INVENTION

The invention relates to methods of fabricating highly uniform, small metallic balls, and to the balls themselves, from capillary stream break-up at high rates.

BACKGROUND OF THE INVENTION

The generation of droplets from capillary stream break-up has been studied at least as early as Lord Rayleigh in the 1800s. More recently, the formation of metallic spheres, or balls, from the break-up of a molten metal capillary stream has been studied. Such balls are commonly used in the electronics industry for various applications, including interconnects for small electronics packages and in the manufacture of conductive pastes. Using the process of capillary stream break-up, the balls can be produced at very high rates—typically tens of thousands of droplets per second. Further, the nature of droplet formation due to capillary stream break-up results in highly uniform balls. The highly uniform size of the metal balls formed from capillary stream break-up is a significant improvement over other methods of forming conductive powders—such as spray atomization or melt spinning—which require the extra step of sieving or sorting the differently sized balls. This extra step is labor intensive, significantly increasing the time and cost of the manufacturing process; however, with such technologies, sorting or sieving is necessary to achieve tight ball diameter tolerances (on the order of five percent).

In the production of metal balls from capillary stream break-up, it is advantageous to effectively cool the balls so that they solidify before landing or bonding with each other. Effective solidification reduces or eliminates (1) irregularly shaped balls that have dented when they impinge and (2) irregularly sized balls that have bonded together because they were insufficiently cooled. Without effective solidification, removal of these defects requires that the balls be sieved or sorted.

SUMMARY OF THE INVENTION

A method for producing highly uniform metallic microspheres, or balls, comprises directing a capillary stream of molten metal from an orifice, wherein a plurality of droplets form from the stream due to capillary stream break-up; electrostatically charging the plurality of droplets; and deflecting the plurality of droplets by directing the droplets through an electric field. In one innovative aspect of the present invention, each droplet travels along a path that is different than the path of the adjacent downstream droplet; and each droplet is captured after the droplet has solidified. In another innovative aspect, the charge applied to each droplet is varied while the electrostatic field remains constant over time. In yet another innovative aspect, the charge applied to the droplets is constant while the electrostatic field is varied over time.

In a preferred embodiment, the electric field is created by a pair of deflection plates, across which a bias voltage is applied. In accordance with another embodiment, the electric field is created by two orthogonal pairs of deflection plates, across each of which a bias voltage is applied. In yet another embodiment, the electric field is created by a pair of rotating deflection plates. In a further embodiment, the droplets may be directed to pass through a chamber filled with a cooled gas.

In a further innovative aspect of the present invention, the metal balls are produced at a rapid rate, wherein the balls are highly uniform, having highly uniform diameters. More particularly, the balls are produced, depending on orifice size and forcing conditions, at a rate preferably in a range of about 1000 to 200,000 balls per second, and preferably at a rate greater than about 4000 balls per second, while maintaining a ball diameter tolerance preferably in a range of about 0.5 to 3.0 percent, and preferably less than about 2.0 percent, without performing a mechanical sieving or sorting step.

Other aspects and features of the present invention will become apparent from consideration of the following description taken in conjunction with the accompanying drawings.

DETAILED DESCRIPTION OF THE PREFERRED EMBODIMENTS

In accordance with the invention, metal balls are produced at a high rate by capillary stream break-up, wherein highly uniform and predictable droplets break from a capillary stream of molten metal. The balls may be formed from one or a combination of various metals, including solder, copper, nickel, titanium, or any metal having physical properties (e.g., melting point) suitable for the process described herein.

Figure 1:
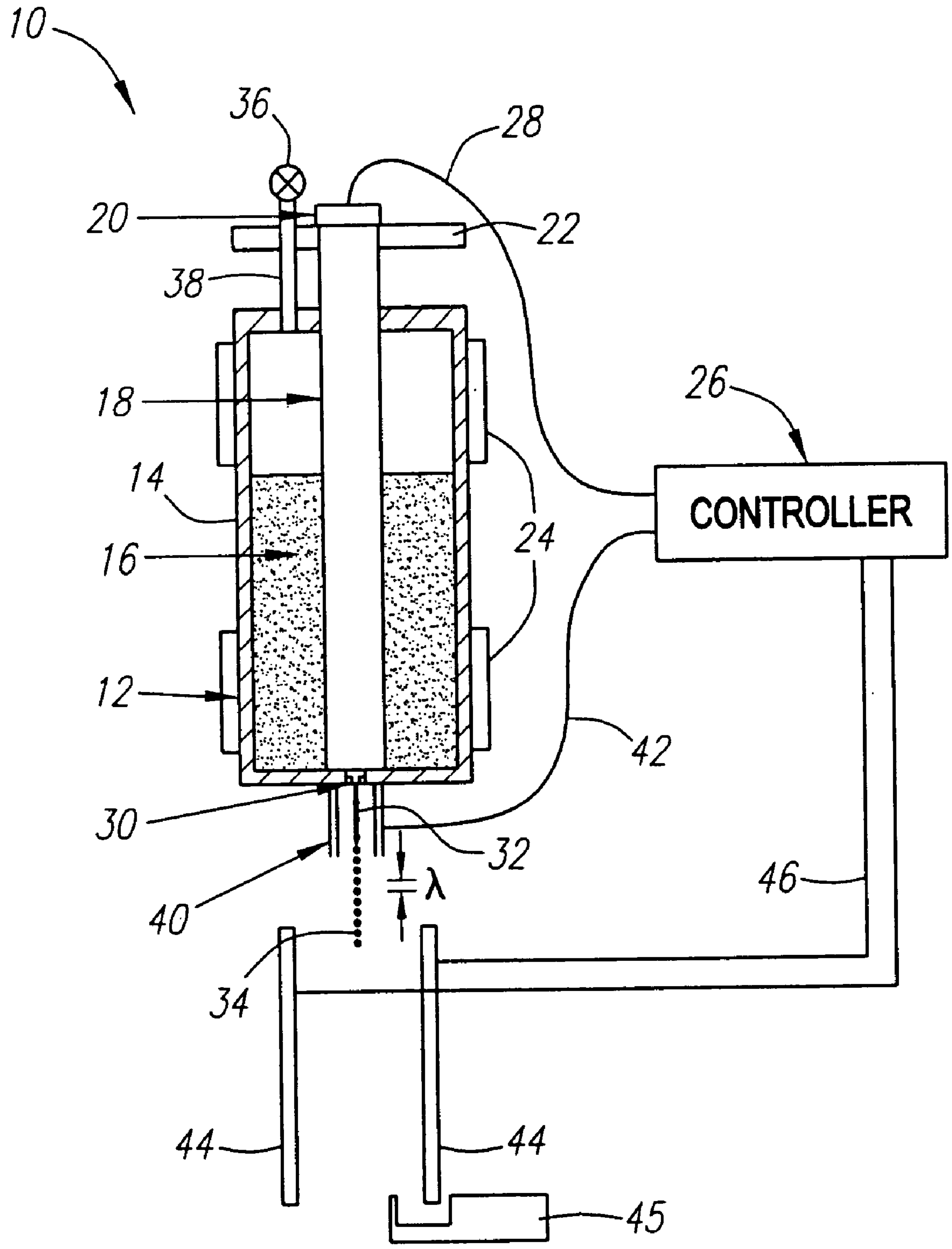
FIG. 1 is a cross sectional view of the droplet generation system.

FIG. 1 shows a system 10 for producing metal balls in accordance with one embodiment. To form a capillary stream, a droplet generator 12 is provided. One example of a droplet generator suitable for these purposes is described in U.S. Pat. No. 6,186,192 to Orme et al., hereby incorporated in full by reference. This patent describes a system for generating a capillary stream of molten metal, from which a continuous series of molten droplets form. Although the patent is directed to producing droplets of molten solder, any metal having a suitable melting point may be used therewith.

The droplet generator 12 includes a chamber 14 adapted to hold a reservoir of molten metal 16 therein. As explained, this molten metal comprises any metal having physical characteristics compatible with the system 10 and method described. The melting point of some metals, for example, may be too high to use with the system 10 shown in FIG. 1. A vibrating rod 18 is slidably disposed within the chamber 14, contacting the molten metal 16. The rod 18 is mechanically coupled to a piezoelectric crystal or transducer 20 and, as described, is used to impart a disturbance in the molten metal. However, it should be appreciated that a disturbance may be imparted mechanically with a piezoelectric transducer with or without a rod or plunger—for example, the piezoelectric transducer may be placed under the orifice to eliminate the rod or plunger—or a disturbance may be imparted from magnetic, electric or acoustic forces.

As shown, the piezoelectric crystal 20 is disposed outside the chamber 14 to protect it from the heat of the molten metal 16, as piezoelectric materials can be damaged if subjected to high temperatures. However, for metals with low melting points, such as solder, it may be possible to immerse the piezoelectric crystal in the molten fluid or position the piezoelectric crystal under the orifice where temperatures are high. To further protect the piezoelectric crystal 20 from heat transferred from the vibrating rod 18, a cooling jacket 22 may be attached to the vibrating rod 18, or to a housing around the rod 18, near the crystal 20 to keep it at a cooler temperature. The cooling jacket 22 may be, for example, fluidly coupled to a circulating water supply that circulates room temperature water through the cooling jacket 22. Additionally, to maintain the molten metal 16 inside the chamber 14 above its melting point, heaters 24 may be coupled to the outer wall of the chamber 14 at spaced-apart locations.

A controller 26, which may comprise one or more microprocessors and one or more power supplies, is electrically coupled to the piezoelectric crystal 20 by electrical connection 28. The controller 26 delivers an alternating electrical signal to the piezoelectric crystal 20, causing a corresponding mechanic response. The vibrating piezoelectric crystal 20 causes the vibrating rod 18, to which the crystal 20 is coupled, to oscillate. The vibrating rod 18 is preferably biased with a periodic waveform, typically with a magnitude of about 50 to 300 Volts, and a fundamental frequency f, which corresponds to the frequency of perturbation applied to the capillary stream for uniform droplet production, determined by the following equation:

$$f = \frac{k \cdot V}{2\pi r_o}, \tag{1.0}$$

wherein V is the droplet or stream velocity, $r_o$ is the orifice radius, and k is a non-dimensional wave number constant, which depends on the fluid properties of viscosity, surface tension and density, and ambient gas density. See M. Orme, "On the Genesis of Droplet Stream Microspeed Dispersions," *Physics of Fluids*, 3, (12) pp 2936–2947, 1991. The constant k tends to vary between 0.4 and 0.8; for inviscid fluids, k equals 0.697. It should be appreciated that uniform droplets may be produced at high rates and that the fundamental frequency f varies according to orifice size and stream velocity. Preferably, the fundamental frequency f, and thus the droplet production rate, is in a range of about 1000 Hz to 200 kHz.

The molten metal 16 is ejected from the chamber 14 through an orifice 30 in the bottom of the chamber 14, from which a stream 32 of the molten metal forms. The oscillation of the vibrating rod 18 produces a standing wave in the molten metal 16 and in the stream 32 as it leaves the orifice 32. Due to capillary stream break-up, molten metal droplets 34 form by detaching from the stream 32. A droplet 34 formed from capillary stream break-up has a diameter typically about twice the diameter of the orifice 30. To control the formation of molten metal droplets 34 leaving the droplet generator 12, a supply 36 delivers nitrogen gas (or other inert gas, such as argon) along a gas line 38 to pressurize the chamber 14, thereby affecting the tendency of molten metal 16 to leave the chamber 14 through the orifice 30. Nitrogen (or other inert gas, such as argon) may also be supplied through a gas line to a detachable end assembly to further control solder droplets. Preferably, the inert gas is a high purity gas, such as research grade or better.

A charge electrode 40 is located near the orifice 30 where droplets 34 break from the capillary stream 32. The charge electrode 40 allows for an electrostatic charge to be selectively applied to any of the droplets 34 on a droplet-by-droplet basis. The charge electrode 40 is coupled to the controller 26 by electrical connection 42. Because of the highly predictable nature of droplet formation from capillary stream break-up, the time at which droplets 34 break from the capillary stream 32 is known to a precise degree, given the function at which the piezoelectric crystal 20 is driven and other system parameters. More particularly, the perturbation on the stream's radius grows exponentially in time, t, as $r(t)=r_o \pm r_o \kappa e^{\beta t}$, where κ and β are the amplitude of the initial perturbation and the disturbance growth rate, respectively. The time at which droplets 34 break from the capillary stream is the time when r(t)=0, i.e., when $t=(1/\beta)\ln(1/\kappa)$. See M. Orme, "On the Genesis of Droplet Stream Microspeed Dispersions," *Physics of Fluids*, 3, (12) pp 2936–2947, 1991.

Figure 2:
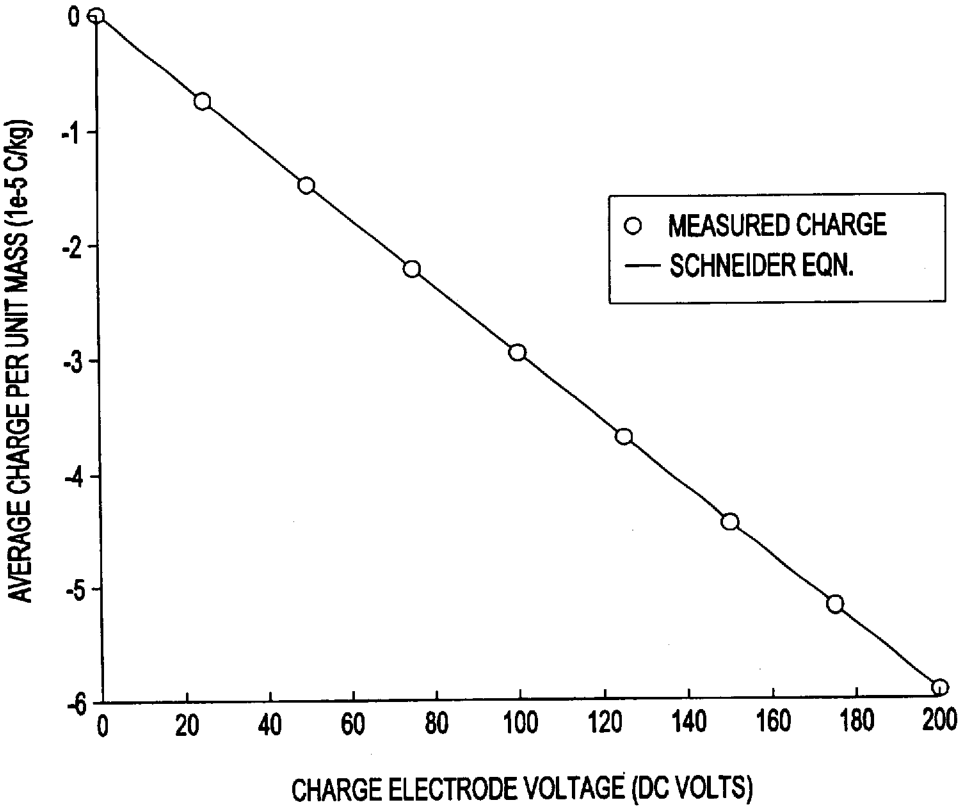
FIG. 2 is a graph of measured and theoretical droplet charge per mass versus charge electrode voltage.

It can be appreciated that an electrostatic charge on the charge electrode 40 causes a corresponding electrostatic charge on the conductive capillary stream 32. When a droplet 34 breaks from the stream 32, the droplet 34 is effectively short-circuited; therefore, that droplet 34 will maintain that electrostatic charge while in flight. The stream is then electrostatically charged to a second amount when the next droplet breaks from the stream 32, wherein that droplet will maintain that second electrostatic charge while in flight. Each droplet can thus be selectively charged, determined by the controller 26, by charging the charge electrode 40 to a predetermined value at the time that each droplet 34 breaks from the stream 32. The electrostatic charge, Q, per mass, m, of each droplet is given theoretically by Schneider's Equation:

$$\frac{Q}{m} = \frac{2\pi\varepsilon_0 V_c}{\rho r_o^2 \ln(b/r_o)}, \tag{2.0}$$

where $\epsilon_o$ is the permitivity of free space, $V_c$ is the charge potential, ρ is the fluid density and b is the electrode radius. See J. M. Schneider, N. R. Lindblad, & C. D. Hendricks, "Stability of an Electrified Liquid Jet," *J. Applied Physics*. 38, 6, 2599, 1967. The graph of FIG. 2 compares measured and predicted results for the charge per unit mass of the droplets, using the apparatus and method described herein. As FIG. 2 shows, Schneider's Equation is useful to predict the charge of the droplets.

A gutter 45 may also be provided to catch undeflected droplets, wherein the gutter 45 is oriented just slightly overlapping an axis defined by the stream 32 so that undeflected droplets will fall into the gutter 45 but deflected droplets will miss it. A heater may be integrated into the gutter 45 to heat the metal caught by the gutter 45 so that the metal remains in liquid form. The collected metal in the gutter 45 can be advantageously recycled back into the chamber 14. To minimize impurities, the metal is preferably filtered.

The droplets 34 of molten metal, formed by the droplet generator 12, are then directed to pass through an electric field preferably formed by at least one pair of deflection plates 44. The bias voltage across the deflection plates 44 is controlled by the 26 controller. When a bias voltage is applied across the deflection plates 44 by electrical connections 46, it can be appreciated that an electric field is formed between the plates 44. As charged droplets 34 pass between the plates 44, and thus through this electric field, the droplets 34 are acted upon by an electrostatic force. The electrostatic force is proportional to the electric field and to the charge of the droplet. Accordingly, the deflection of each droplet 34 caused by the deflection plates 44 can be controlled by imparting to each droplet 34 a particular electrostatic charge.

The magnitude of the electrostatic force acting on the droplet 34 determines the degree to which the droplet 34 is deflected—from an axis defined by the capillary stream 32—and thus the path the droplet 34 travels. The deflection ($x_d$) of a charged droplet due to the electrostatic field of a pair of deflection plates can be approximated by Fillmore's Approximation:

$$x_d = \frac{QE}{mv_0^2} l_{dp}\left(z_p - \frac{l_{dp}}{2}\right), \tag{3.0}$$

where $l_{dp}$ is the length of the deflection plates, Q is the charge, E is the electric field strength, m is the mass, $v_o$ is the droplet speed and $z_p$ is the vertical distance between the deflection plate and the target. See G. L. Fillmore, W. L. Buehner, & D. L. West, "Drop Charging and Deflection in an Electrostatic Ink Jet Printer," *IBM J. Res. Dev. Jan*, 1977. A more accurate model that considers the effects of drag is given by the equations:

$$m\frac{dv_x}{dt} = QE - D\sin\theta \tag{4.0}$$

$$m\frac{dv_z}{dt} = mg - D\cos\theta \tag{4.1}$$

$$D = C_d \cdot \frac{1}{2}\rho_a v^2 \cdot A \tag{4.2}$$

$$C_d = \frac{24}{Re} + \frac{6}{1+\sqrt{Re}} + 0.4 \tag{4.3}$$

where D is the aerodynamic drag force, g is the gravitational constant, θ is the deflection angle measured from the undeflected stream, A is the frontal surface area of the sphere, $C_d$ is the dimensionless drag coefficient, and Re is the dimensionless Reynolds number. See Q. Liu, C. Huang, and M. Orme, "Mutual Electrostatic Charge Interactions Between Closely Spaced Charged Solder Droplets," *J. of Atomization and Sprays*, vol. 10, no. 6, pp 565–585, 2000.

Figure 3:
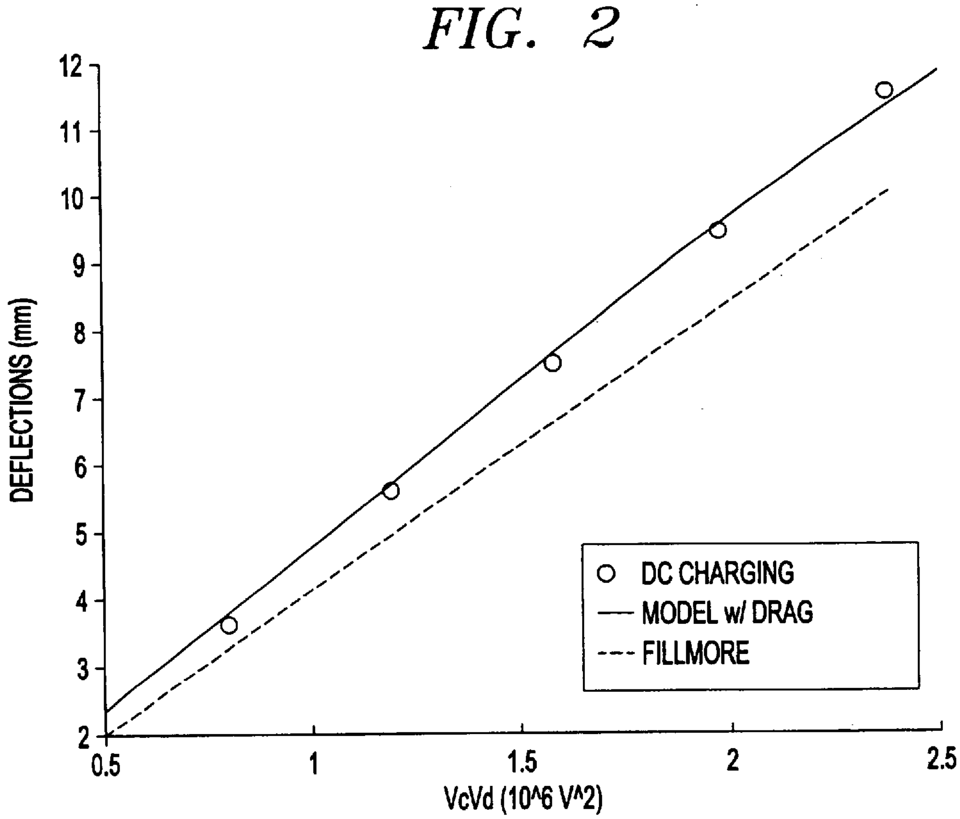
FIG. 3 is a graph of measured and theoretical droplet deflection given deflection plate biasing.

As FIG. 3 shows, this model (Equations 4.0–4.3), which incorporates drag, very accurately predicts measured deflection values. Fillmore's Approximation (Equation 3.0) also tends to indicate a droplet's deflection, although it tends to underestimate the actual deflection somewhat.

To produce highly uniform and substantially spherical metal balls with little or no defects, it is important that the droplets solidify in flight. Cooling the spheres in flight avoids the problem of bonding between the droplets, either in flight or during their collection. Further, solidifying the droplets before they are collected avoids defects of their spherical shape that would result from a molten, or partially molten, droplet's hitting a hard surface.

When the molten droplets are directed in a straight line, or at least in the same path, it has been found that the droplets may not effectively cool. This is because the droplets are effectively isolated from the surrounding gas by the aerodynamic wake of their neighbor drop. When the droplets are deflected out of this protective shield they cool more readily by convective heat transfer from the hot drop to the cooler surrounding gas. This heating of the surrounding gas by the hot drop occurs as thermal energy diffuses from the droplets to the gas through which the droplets pass, and as the droplets lose thermal energy they cool correspondingly, preferably solidifying into metallic spheres before they land. Prior to the present invention, the rate at which the droplets are produced would have to be significantly reduced or the distance over which the droplets travel prior to collection would have to be significantly increased in order to more effectively cool the molten droplets in flight. The associated cost and inefficiency makes these solutions less than desirable.

The present invention, however, provides a more desirous and effective method of cooling the droplets in flight. In accordance with the present invention, the molten droplets are directed in paths that are different from the path of their adjacent downstream droplet, thereby removing them from the heated wake of the neighboring drop, and enabling a more efficient heat transfer between the drops and the surrounding gas. An advantage of this efficient cooling is that balls can be produced at very high rates several orders of magnitude over prior art methods, i.e., preferably at a rate in a range of about 1,000 to 200,000 balls per second (depending on orifice diameter and stream speed), and more preferably at a rate on the order of 10,000 balls per second, or greater, while still maintaining a high degree of uniformity without having to perform an additional step of mechanically sieving or sorting. More particularly, the ball diameter may be maintained within a tolerance of a mean ball diameter in the range of about 0.5 to 3.0 percent, and preferably less than 2.0 percent.

When discussing droplets in a series of droplets, downstream droplets are understood to be droplets that are produced earlier in the series, whereas upstream droplets are produced later. A droplet thus follows downstream droplets and is followed by upstream droplets (the "stream" in this case referring to the downward flow of metal). An adjacent droplet is a droplet in a series of droplets that is immediately upstream or downstream in the series. For these definitional purposes, droplets that are not charged/deflected are ignored. For example, it may be advantageous to only charge every other droplet, allowing half the droplets to fall undeflected and caught, perhaps, by a gutter as described above. Charging only every other droplet may be useful for minimizing the effects of electrostatic forces between the droplets, which may alter their deflection. Therefore, where only every other droplet is charged, for example, a droplet's adjacent downstream droplet is the droplet produced two cycles of the excitation frequency earlier, not the droplet produced immediately before it.

Figure 4B:
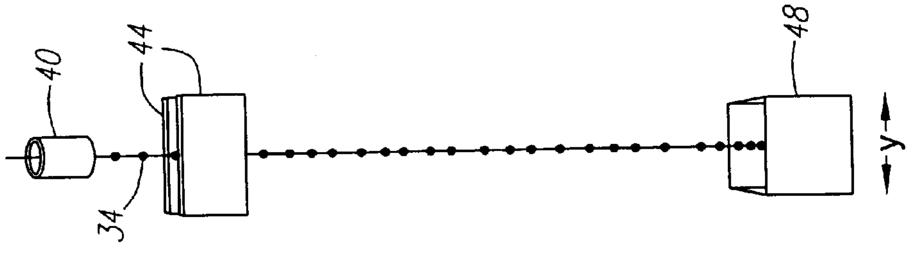
FIGS. 4*a* and 4*b* are front and side views, respectively, of an embodiment of the deflection/cooling system.
Figure 4A:
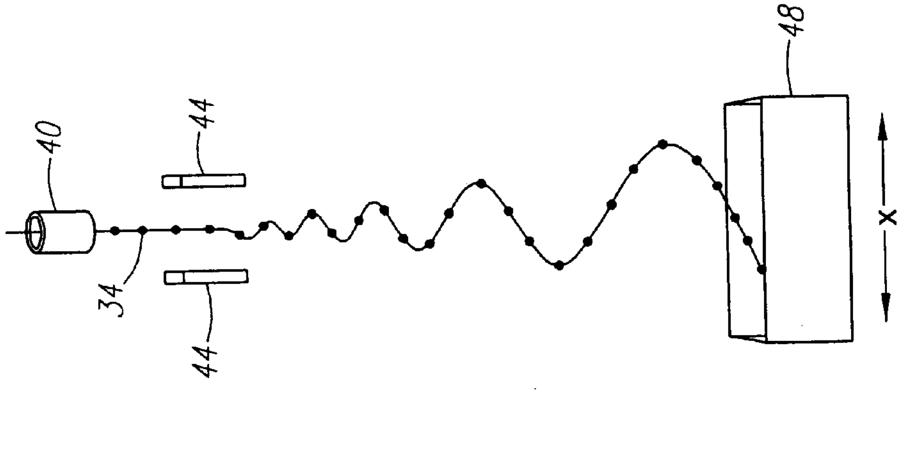

FIGS. 4*a* and 4*b* illustrate one embodiment of a method of deflecting the droplets so that each travels in a path different from its adjacent downstream droplet. As described above, each droplet 34 is selectively charged by the charge electrode 40. In this example, the droplets 34 are charged with a waveform varying in amplitude. The waveform by which the charge electrode 40—and thereby the droplets 34—are charged is produced by, e.g., a waveform generator in the controller 26, and it should be understood that any waveform that varies the charge on the droplets 34 could be used (e.g., sawtooth, sinusoid, or the like). The droplets 34 are directed between the pair of deflection plates 44, where the droplets 34 are acted upon by an electrostatic force. Each droplet 34 deflects a distance that corresponds to its charge, as described above. As FIGS. 4*a* and 4*b* show, the droplets are collected by a collector 48, preferably after they have solidified.

Figure 5B:
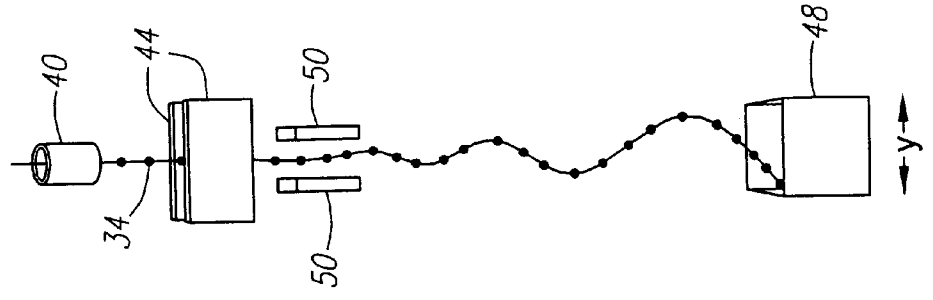
FIGS. 5*a* and 5*b* are front and side views, respectively, of another embodiment of the deflection/cooling system.
Figure 5A:
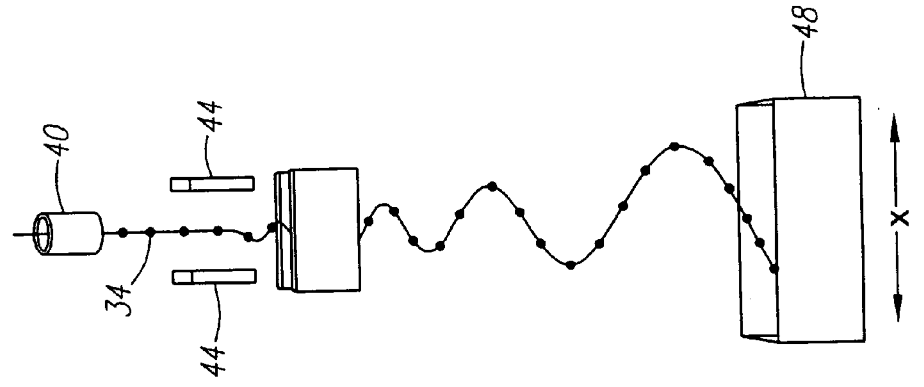

In accordance with another embodiment, electrostatic deflection on two orthogonal axes is used to separate the balls, to more effectively cool the droplets. As shown in FIGS. 5*a* and 5*b*, the selectively charged droplets 34 are directed to pass through two pairs of deflection plates 44,50, which are preferably orthogonal to each other. The embodiment shown in FIG. 5 operates as the embodiment of FIG. 4, except that the droplets 34 are deflected along two axes. Further, the actual deflection of the droplets 34 in each direction can be tuned by, inter alia, adjusting the bias voltage across each pair of deflection plates 44,50.

As described above, a constant electric field (supplied by deflection plates) acts upon differently charged droplets. Alternatively, in connection with the embodiments shown in FIGS. 4 and 5, the droplets 34 could be deflected in similar patterns by charging each droplet 34 with the same electrostatic charge and further biasing the deflection plates 44,50 with an amplitude varying waveform. In this way, a varying electrostatic field would act upon uniformly charged droplets, instead of a constant field acting upon differently charged droplets.

Figure 6:
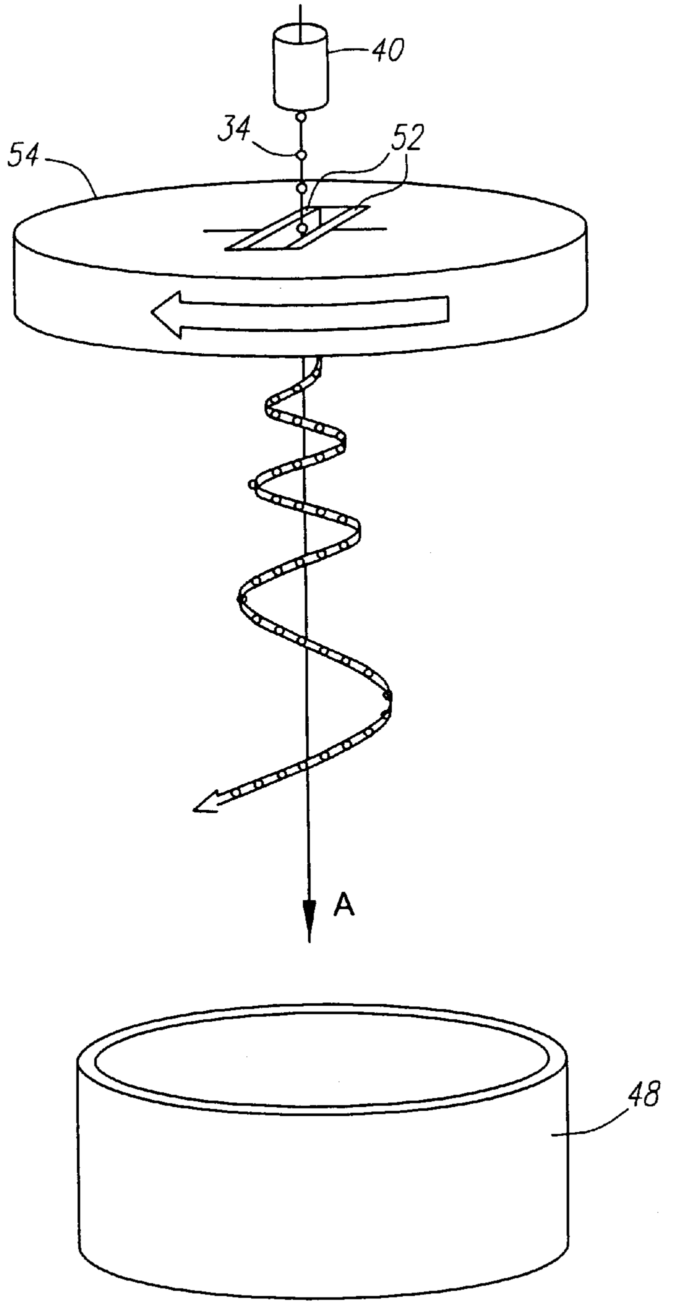
FIG. 6 is a view of another embodiment of the deflection/cooling system.

In yet another embodiment for directing the droplets in a path different from their adjacent downstream droplet, FIG. 6 shows a pair of rotating deflection plates 52 attached to a rotating disc 54. As the assembly of disc 54 and deflection plates 52 rotates, so does the corresponding electric field in the region between the plates 52. When charged droplets 34 pass through the rotating deflection plates 52, the droplets 34 deflect radially outward from an axis A defined by the capillary stream. The droplets are then collected by collector 48, preferably after the droplets have solidified into metal balls. Depending on the desired deflection pattern of the droplets 34, the bias voltage across the rotating deflection plates 52 and/or the electrostatic charge of the droplets 34 may be constant or variable.

Many other methods of deflecting the molten metal droplets can be used without departing from the inventive concepts contained herein. For example, the droplets could be directed through a magnetic field. Because the droplets are essentially moving charges, a charged droplet moving through such a field would deflect due to the Lorentz force. Alternatively, the droplets could be separated with an aerodynamic force, e.g., by a fan spinning around the axis defined by the capillary stream, similar to the embodiment shown in FIG. 6, or sources of transverse aerodynamic forces, e.g., transversely oriented air jets or the like.

Figure 7:
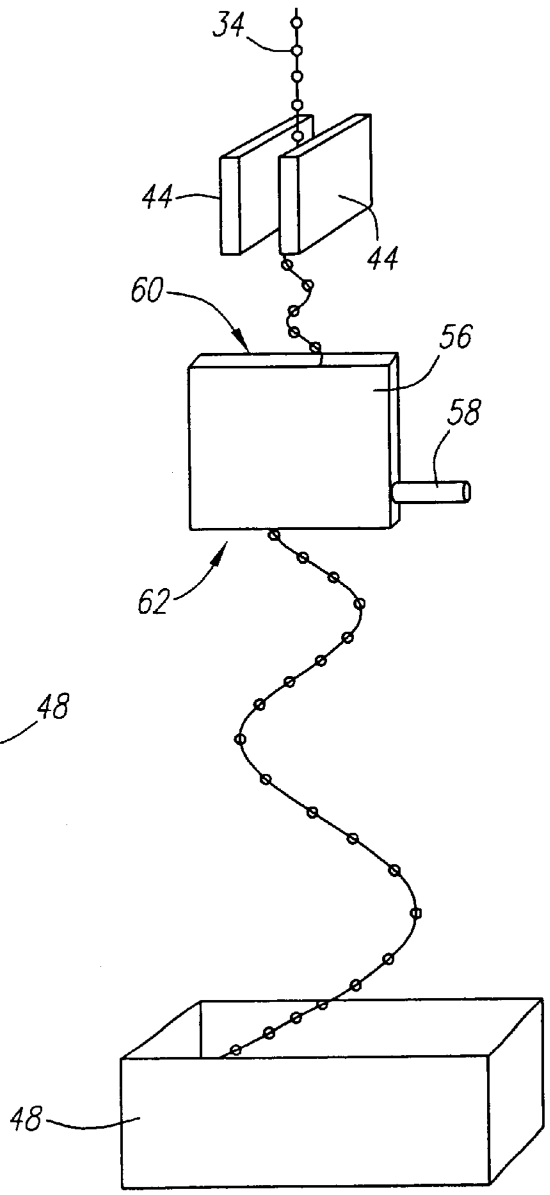
FIG. 7 is a view of another embodiment of the deflection/cooling system.

To further facilitate the cooling of the droplets in flight, the droplets may be actively cooled. As FIG. 7 depicts, the charged droplets 34 are deflected by, e.g., a pair of deflection plates 44, and are then directed through a cooling chamber 56. The cooling chamber 56 is filled with a gas, preferably a cryogenic gas at a very low temperature, through an inlet port 58. The gas is heated as it receives thermal energy from the droplets 34. This heated gas can escape through open ends 60,62 in the top and bottom of the chamber 56, as cooler gas is resupplied through the inlet port 58. When the droplets 34 pass through the low-temperature environment of the chamber 56, they cool more effectively because of the greater temperature differential between the droplets and their environment.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the spirit and scope of the appended claims.

What is claimed is:

1. A method for producing highly uniform metallic balls comprising:

directing a capillary stream of molten metal from an orifice, wherein a plurality of droplets form from the stream due to capillary stream break-up;

imparting an electrostatic charge to at least some of the plurality of droplets;

deflecting the plurality of droplets by directing the droplets through an electric field, wherein the electrical field is rotating around an axis defined by the capillary stream, and wherein each droplet travels along a path that is different than the path of the adjacent downstream droplet; and capturing each droplet after the droplet has solidified.

2. The method of claim 1, wherein the electrostatic charge of each droplet is different than the electrostatic charge of the directly adjacent downstream droplet.

3. The method of claim 2, wherein the deflecting step is accomplished by directing the droplets between a first pair of deflection plates, a first voltage being applied across the first pair of deflection plates that causes a first electric field therebetween.

4. The method of claim 3, wherein the deflecting step is further accomplished by directing the droplets between a second pair of deflection plates, a second voltage being applied across the second pair of deflection plates that causes a second electric field therebetween.

5. The method of claim 4, wherein the first and second voltages are constant.

6. The method of claim 4, wherein the first and second pairs of deflection plates are approximately orthogonal.

7. The method of claim 1, wherein the electric field is at least in part created by a pair of deflection plates, the deflection plates rotating around an axis defined by the capillary stream.

8. The method of claim 1, further comprising the step of actively cooling the droplets in flight by directing the droplets through a chamber filled with a cooled gas.

9. The method of claim 1, wherein the diameters-of the metallic balls are within a range of about 0.5 to 3.0 percent of the mean ball diameter.

10. The method of claim 1, wherein the balls are produced at a rate in the range of about 1000 to 200,000 balls per second.

11. A method for producing highly uniform metallic balls comprising:

directing a capillary stream of molten metal from an orifice, wherein a plurality of droplets form from the stream due to capillary stream break-up;

imparting an electrostatic charge to at least some of the plurality of droplets;

deflecting the plurality of droplets by directing the droplets through a electric field, wherein the electrical field is continuously varying and rotating around an axis defined by the capillary stream and wherein each droplet travels along a path that is different than the path of the adjacent downstream droplet; and capturing each droplet after the droplet has solidified.

12. The method of claim 11, wherein the electric field is at least in part created by a pair of deflection plates, the deflection plates rotating around an axis defined by the capillary stream.

13. The method of claim 11, wherein the electrostatic charge of each of the plurality of droplets is substantially the same.

14. A method for producing highly uniform metallic balls comprising:

directing a capillary stream of molten metal from an orifice, wherein a plurality of droplets form from the stream due to capillary stream break-up;

imparting an electrostatic charge to at least some of the plurality of droplets;

deflecting the plurality of droplets by passing the droplets through a magnetic field, wherein each droplet travels along a path that is different than the path of the adjacent downstream droplet; and capturing each droplet after the droplet has solidified.

* * * * *